US012712149B2

(12) United States Patent
Yokosuka et al.

(10) Patent No.: US 12,712,149 B2
(45) Date of Patent: Aug. 18, 2026

(54) CHARGED PARTICLE BEAM DEVICE AND IMAGING METHOD

(71) Applicant: Hitachi High-Tech Corporation, Tokyo (JP)

(72) Inventors: Toshiyuki Yokosuka, Tokyo (JP); Hideyuki Kotsuji, Tokyo (JP); Hajime Kawano, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 467 days.

(21) Appl. No.: 18/328,828

(22) Filed: Jun. 5, 2023

(65) Prior Publication Data

US 2023/0420215 A1 Dec. 28, 2023

(30) Foreign Application Priority Data

Jun. 22, 2022 (JP) ................................. 2022-100088

(51) Int. Cl.

*H01J 37/244* (2006.01)
*H01J 37/22* (2006.01)
*H01J 37/302* (2006.01)
*H01J 37/32* (2006.01)

(52) U.S. Cl.

CPC ............ *H01J 37/244* (2013.01); *H01J 37/22* (2013.01); *H01J 37/3026* (2013.01); *H01J 37/32174* (2013.01); *H01J 2237/2448* (2013.01)

(58) Field of Classification Search

CPC ...... H01J 37/244; H01J 37/22; H01J 37/3026; H01J 37/32174; H01J 2237/2448; H01J 37/263; H01J 37/28; H01J 2237/0048; H01J 2237/281; H01J 37/222

See application file for complete search history.

(56) References Cited

U.S. PATENT DOCUMENTS 7,851,754 B2 * 12/2010 Komuro ................ H01J 37/268 250/311
9,773,646 B2 * 9/2017 Oba ...................... H01J 37/321
11,107,655 B2 * 8/2021 Ogata ................... H01J 37/222
2002/0123229 A1 * 9/2002 Ono .................. H01J 37/32082 257/E21.311
2003/0051814 A1 * 3/2003 Kwon ............... H01J 37/32935 118/733

(Continued)

FOREIGN PATENT DOCUMENTS

JP 2006-066398 A 3/2006
JP 2016-066553 A 4/2016

(Continued)

OTHER PUBLICATIONS

Korean Office Action issued on Feb. 11, 2025 for Korean Patent Application No. 10-2023-0069918.

*Primary Examiner* — David A Vanore
(74) *Attorney, Agent, or Firm* — Volpe Koenig

(57) ABSTRACT

A charged particle beam device for irradiating a sample arranged in a sample chamber to be observed with an electron beam includes: a plasma generation device to which a bias voltage is applicable to generate plasma containing charged particles for applying charges onto a side wall of a pattern of the sample; and a guide that guides the charged particles in the plasma generated by the plasma generation device to the pattern of the sample.

13 Claims, 6 Drawing Sheets

(56) References Cited

U.S. PATENT DOCUMENTS

2004/0094402 A1* 5/2004 Gopalraja ............... C23C 14/35 204/192.12
2006/0045987 A1 3/2006 Chandler et al.
2010/0181499 A1* 7/2010 Vanderberg ............. H01J 37/05 250/281
2016/0093467 A1 3/2016 Torikawa et al.
2016/0240346 A1* 8/2016 Oba ........................ H01J 37/08
2016/0299103 A1* 10/2016 Saleh ................ H01J 37/32449
2017/0062180 A1* 3/2017 Budach ................... H01J 37/36
2017/0294291 A1* 10/2017 Saleh ................ H01J 37/32825
2019/0348255 A1 11/2019 Bizen et al.
2020/0135437 A1* 4/2020 Oba ........................ H01J 37/08
2021/0082660 A1* 3/2021 Tsutsumi .............. H01J 37/256
2021/0296086 A1* 9/2021 Bishop .................. H01J 37/244
2022/0059326 A1* 2/2022 Jiang ................. H01J 37/32871
2022/0351938 A1* 11/2022 Nakamura ............ H01J 37/265
2023/0411108 A1* 12/2023 Kotsuji ................. H01J 37/026
2023/0420215 A1* 12/2023 Yokosuka ............... H01J 37/22
2024/0321543 A1* 9/2024 Kotsuji ................. H01J 37/026

FOREIGN PATENT DOCUMENTS

JP 6782795 B2 11/2020
WO WO-2018154638 A1 * 8/2018 .............. H01J 37/28
WO WO-2024224498 A1 * 10/2024 ............... H05H 1/46
WO WO-2025120733 A1 * 6/2025 .............. H01J 37/20

* cited by examiner

CHARGED PARTICLE BEAM DEVICE AND IMAGING METHOD

BACKGROUND OF THE INVENTION

1. Field of the Invention

The present disclosure relates to a charged particle beam device and an imaging method.

2. Description of the Related Art

With miniaturization and high integration of semiconductor patterns, a slight shape difference of a semiconductor pattern affects operation characteristics of a device, and there is an increasing demand for managing a shape of a semiconductor pattern. Accordingly, a scanning electron microscope (SEM) used for inspecting and measuring a semiconductor pattern is required to have higher sensitivity and higher accuracy than the conventional art.

In recent years, a structure in which devices are stacked in a three-dimensional direction such as a 3D-NAND memory has been developed. In such a device, it is necessary to inspect a pit or a groove. However, concerning a pit or a groove in a single insulating film that has a problem that electrons in a deep portion of the pit or the groove cannot be detected when observed with an electron microscope, electrons in the pit or the groove can be pulled up by forming positive charges on a surface (in an upper portion) of the pit or the groove. Meanwhile, in a multilayer device such as a 3D-NAND, since a conductive film is sandwiched between layers, even if charges are set in an upper portion of a pit or a groove, an electric field does not reach a deep portion of the pit or the groove. As a result, electrons in the pit or the groove cannot be pulled up like those in a single film, and it is difficult to inspect the pit or the groove.

For this reason, an approach is also adopted in which the energy of electrons to be irradiated is increased to obtain information such as a shape of the pit or the groove, and high-energy backscattered electrons (BSE) are detected. As a result, although information about the pit or the groove can be acquired, electrons penetrating through the multilayer film are also detected, and thus, minute information (e.g., surface information) may be lost. In addition, since the ratio of BSE emitted to secondary electrons is small (to 20%), high frame integration (long time) at a large current is required to secure the amount of signals to be detected, and there is a concern from the viewpoint of imaging throughput and damage.

SUMMARY OF THE INVENTION

As mentioned above in the Description of the Related Art, a multilayer film has a problem that an electric field for pulling up secondary electrons generated in a pit or a groove cannot be formed in the pit or the groove.

Furthermore, while the pit or the groove is irradiated with electrons, low-energy electrons adhere to an inner wall of the pit or the groove, and the inner wall is negatively charged. In a case where the inner wall is negatively charged, the inner wall becomes an energy barrier against secondary electrons rising from a deep portion of the pit or the groove, and thus an amount of detected signals further decreases. A method for removing secondary electrons adhering to the inner wall is disclosed in JP 6782795 B2. In JP 6782795 B2, an electric field is applied to a sample or an electrode in the vicinity of the sample to promote movement of negative charges that adhere thereto, thereby the negative charges. According to this method, negative charges on the side wall can be alleviated or eliminated. However, it is still impossible to form in a pit or a groove an electric field for pulling up secondary electrons generated in the pit or the groove.

Therefore, an object of the present disclosure is to form in a pit or a groove an electric field for pulling up secondary electrons generated in the pit or the groove by applying certain charges onto an inner wall of the pit or the groove using charged particles in plasma generated by a plasma generation device.

An aspect of the present disclosure provides a charged particle beam device for irradiating a sample arranged in a sample chamber to be observed with a charged particle beam, the charged particle beam device including: a plasma generation device to which a bias voltage is applicable to generate plasma containing charged particles for applying charges onto a side wall of a pattern of the sample; and a guide that guides the charged particles in the plasma generated by the plasma generation device to the pattern of the sample.

According to the present disclosure, by applying certain charges onto the inner wall of the pit or the groove using the charged particles in the plasma generated by the plasma generation device, an electric field for pulling up secondary electrons generated in the pit or the groove is formed in the pit or the groove.

DESCRIPTION OF THE PREFERRED EMBODIMENTS

Figure 1:
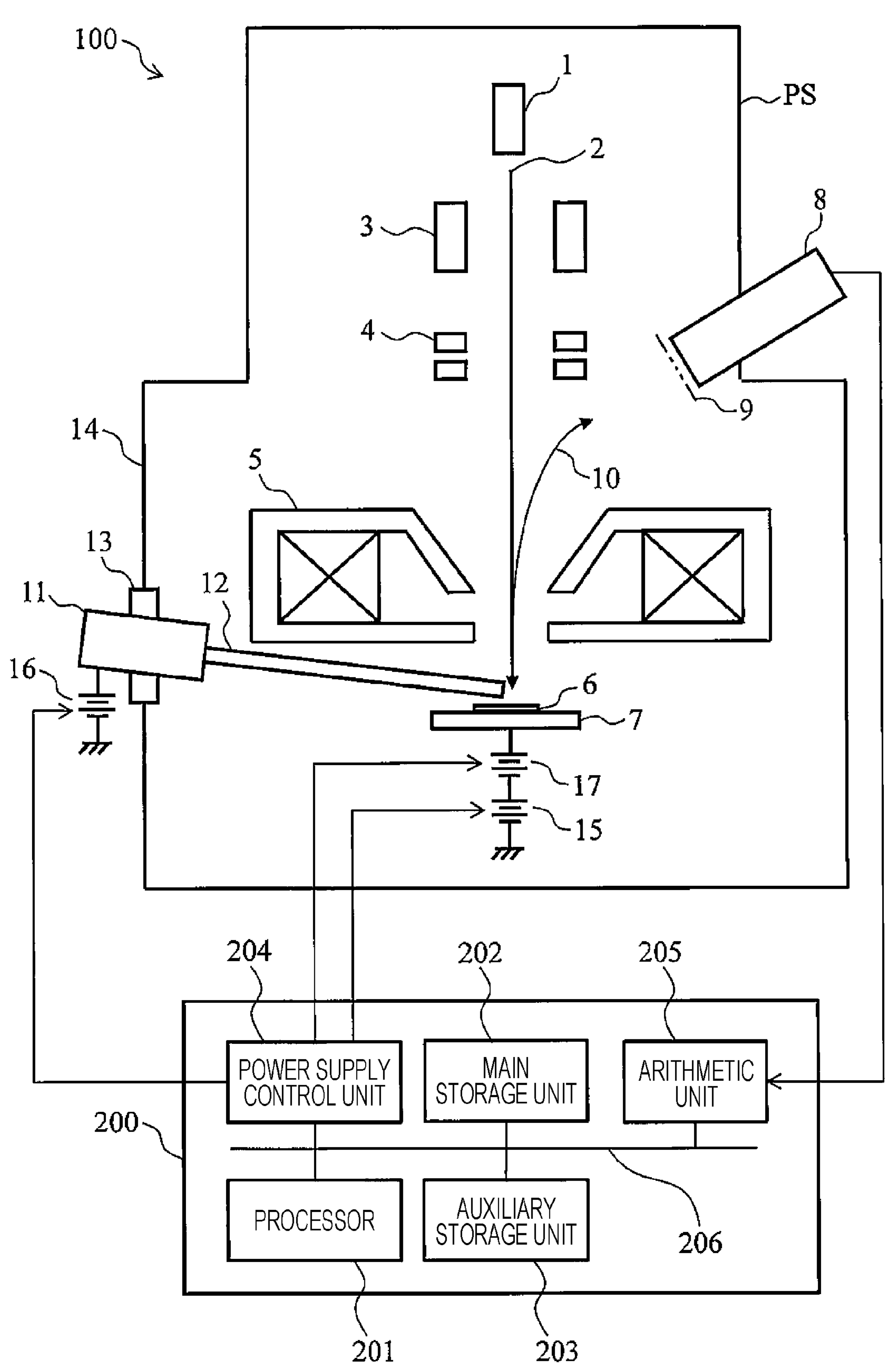
FIG. 1 is a diagram illustrating a configuration of a charged particle beam device according to an embodiment.

Hereinafter, the present embodiment will be described with reference to the drawings. In the drawings, elements that are functionally the same may be denoted by the same numeral. Note that, although the drawings illustrate embodiments and implementation examples in accordance with the principles of the present disclosure, they are for the purpose of understanding the present disclosure and are not used to interpret the present disclosure in a limited manner. The description herein is merely exemplary and is not intended to limit the claims or applications of the present disclosure in any way.

Although the present embodiment will be described in detail enough so that those skilled in the art can carry out the present disclosure, it should be understood that other implementations may be made, and configurations and structures may be modified and various elements may be replaced without departing from the scope and spirit of the technical idea of the present disclosure. Therefore, the following description should not be interpreted as being limited thereto.

Charged Particle Beam Device

With reference to FIG. 1, a charged particle beam device 100 according to an embodiment will be described. As an example, the charged particle beam device 100 includes an electron beam optical system PS (charged particle beam optical system) including an electron gun 1, a condenser lens 3, a deflector 4, and an objective lens 5. Under the electron beam optical system PS, a vacuum sample chamber 14 in which a stage 7 for placing a sample 6 to be observed is placed is installed.

An electron beam 2 (primary electron beam) generated and accelerated by the electron gun 1 is converged by the condenser lens 3 and converged on the sample 6 on the stage 7 by the objective lens 5. The deflector 4 (scanning deflector) causes the electron beam (charged particle beam) 2 to scan an electron beam scanning region of the sample 6. When the electron beam 2 scans the electron beam scanning region of the sample 6, electrons excited in the sample 6 are emitted from the sample 6 as secondary electrons 10. The emitted secondary electrons 10 are detected by a secondary electron detector 8. An image processing unit 205 connected to the secondary electron detector 8 converts a detection signal detected by the secondary electron detector 8 into an image.

An energy filter 9 capable of discriminating the secondary electrons 10 by energy is provided at a front stage (on an incident surface side) of the secondary electron detector 8. A charged state of the sample 6 can be estimated from a change in detection signal when a voltage applied to the energy filter 9 is changed.

The energy of the electron beam 2 (primary electron beam) that scans the electron beam scanning region of the sample 6 is determined based on an acceleration voltage of the electron gun 1 and a voltage applied to the stage. An amount of the emitted secondary electrons 10 is related to the energy of the incident primary electrons, and a charged state of a surface of the sample 6 varies depending on a magnitude relationship between an electron flow of the primary electrons and an electron flow of the secondary electrons 10. The charged amount of the sample 6 also varies depending on the material properties, the shape, and the like of the sample 6. In addition, the charged amount of the sample 6 is not uniform over the entire surface of the sample 6, and has a distribution that varies depending on the position of the surface of the sample 6 according to the material properties, the shape, and the like.

The charged particle beam device 100 includes a plasma generation device 11 that controls the charging of the sample 6. Any bias voltage can be applied to the plasma generation device 11. The plasma generation device 11 generates plasma and emits the plasma or charged particles in the plasma toward the stage 7 on which the sample 6 is placed. The plasma generation device 11 is connected to a wall surface of the sample chamber 14 by a connection member 13 having an insulating spacer. A guide 12 disposed in the sample chamber 14 is connected to the plasma generation device 11. The guide 12 is made of metal, has a hollow portion therein for guiding plasma PZ (see FIG. 2) generated by the plasma generation device 11. The plasma PZ is emitted from a leading end of the guide 12 through the hollow portion.

The plasma generation device 11 is provided on the inner wall of the sample chamber 14 in an insulated state by the connection member 13 having the insulating spacer. The insulating spacer is made of an insulating material such as ceramics, and functions to electrically insulate the plasma generation device 11 from the sample chamber 14. Since the plasma generation device 11 is insulated from the sample chamber 14, the potential of the sample chamber 14 can be stably maintained regardless of an operation state of the plasma generation device 11. A plasma power supply 16 connected to the plasma generation device 11 arbitrarily controls the potentials of the plasma generation device 11 and the guide 12.

A retarding power supply 15 applies a retarding voltage. A radio frequency power supply 17 applies a radio frequency bias voltage. The retarding voltage and the radio frequency bias voltage will be described below.

Next, a control device 200 of the charged particle beam device 100 will be described. The control device 200, which is a computer system, includes a processor 201, a main storage unit 202, an auxiliary storage unit 203, a power supply control unit 204, an image processing unit 205, and a bus 206 having respective modules for them. The computer system constituting the control device 200 may be a single system or a system in which a plurality of systems are combined together.

The processor 201 is a central processing arithmetic unit. The processor 201 is, for example, a central processing unit (CPU), a digital signal processor (DSP), an application specific integrated circuit (ASIC), or the like. The processor 201 develops a program stored in the auxiliary storage unit 203 in a work area of the main storage unit 202 in an executable manner to execute the program. The main storage unit 202 temporarily stores the program executed by the processor 201, data processed by the processor, and the like. The main storage unit 202 is, for example, a flash memory, a random access memory (RAM), or the like. The auxiliary storage unit 203 is, for example, a read only memory (ROM), a hard disk drive (HDD), a solid state drive (SSD), or the like.

The power supply control unit 204 controls voltages applied by the retarding power supply 15, the plasma power supply 16, and the radio frequency power supply 17 described above. The power supply control unit 204 is communicably connected to the retarding power supply 15, the plasma power supply 16, and the radio frequency power supply 17. The power supply control unit 204 instructs the plasma power supply 16 about a bias voltage to be applied to the plasma generation device 11. The plasma power supply 16 applies the instructed bias voltage to the plasma generation device 11. In addition, the power supply control unit 204 instructs the retarding power supply 15 about a retarding voltage to be applied to the stage 7. The retarding power supply applies the instructed retarding voltage to the stage 7. In addition, the power supply control unit 204 instructs the radio frequency power supply 17 about a radio frequency voltage to be superimposed on the retarding voltage. The radio frequency power supply 17 superimposes the instructed radio frequency voltage on the retarding voltage.

The power supply control unit 204 changes the voltage applied to the plasma generation device 11 with a predetermined time width and a predetermined voltage change width until a final voltage is reached. For example, in a case where a bias voltage to be finally applied to the plasma generation device 11 is 250 V, the bias voltage applied to the plasma generation device 11 is changed in the order of 50 V, 100 V, 150 V, 200 V, and 250 V with the predetermined time width.

The image processing unit 205 converts a detection signal detected by the secondary electron detector 8 into an image. In addition, the image processing unit 205 calculates a contrast of the image. The calculated contrast is stored in, for example, the auxiliary storage unit 203 in association with the bias voltage applied to the plasma generation device 11. Note that the calculated contrast may be stored in association with the charged amount of the sample 6 detected by the energy filter.

The control device 200 functions as an estimation unit that estimates a shape of a pattern of the sample 6 from a change in signal detected by the secondary electron detector 8 when the bias voltage applied to the plasma generation device 11 is changed. Specifically, the control device 200 estimates a shape of an unknown pattern by collating a luminance change of the unknown pattern with respect to the bias voltage applied to the plasma generation device 11 with the database. This database stores a plurality of luminance changes of known patterns with respect to the bias voltage applied to the plasma generation device 11. Alternatively, the control device 200 estimates a shape of an unknown pattern by collating a luminance change of the unknown pattern with respect to a charged amount obtained by actual measurement with the database. This database stores a plurality of luminance changes of known patterns with respect to a charged amount obtained by the analysis.

In addition, the control device 200 functions as a switching unit that switches between the irradiation of the sample 6 with the electron beam 2 and the irradiation of the sample 6 with the charged particles in the plasma generated by the plasma generation device 11 at a predetermined timing.

Figure 2:
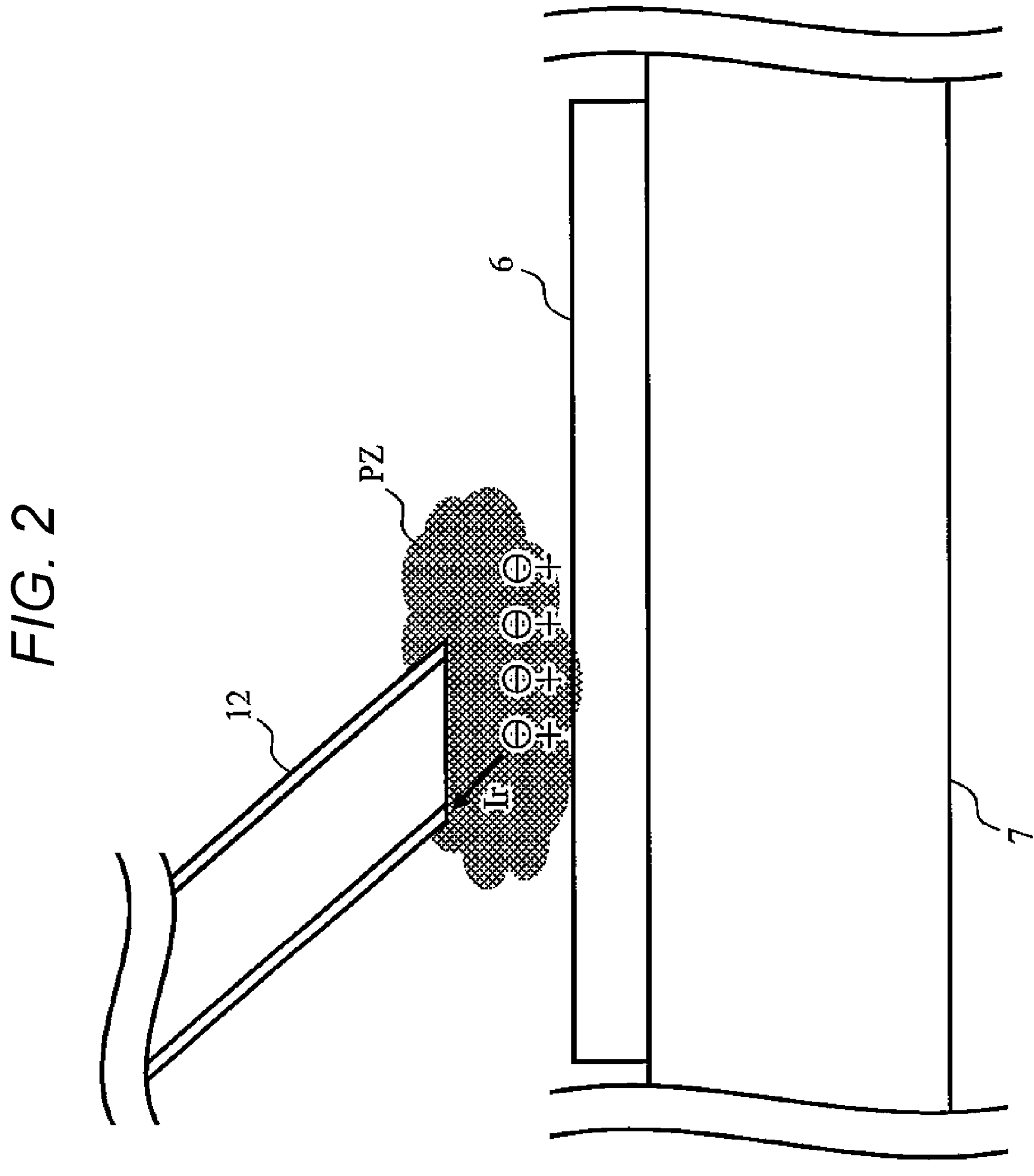
FIG. 2 is a conceptual diagram illustrating a state in which a sample is irradiated with charged particles in plasma generated by a plasma generation device according to the embodiment.

The operation for controlling the charging of the sample 6 using the plasma generation device 11 will be described with reference to FIG. 2. The plasma PZ generated by the plasma generation device 11 contains electrons and positive ions, and is usually in an electrically neutral state. However, when the positively charged sample 6 is irradiated with plasma, positive charges of the sample 6 are neutralized by electrons in the plasma. As a result, the number of electrons in the plasma PZ decrease, the charge balance in the plasma PZ collapses, and a current flows to the guide 12 via the plasma PZ, thereby controlling the potential of the sample 6.

Next, the function of the guide 12 will be described. The plasma PZ generated by the plasma generation device 11 has no directivity. Therefore, when the guide 12 is not provided, the plasma PZ is diffused from the plasma generation device 11 into the sample chamber 14 by an electric field created by the plasma PZ itself and by natural diffusion. When no electric field or the like acts, the plasma PZ diffuses into the sample chamber 14. When the plasma PZ reaches the sample 6, a charging potential of the sample 6 can be controlled. However, the condenser lens 3 and the like for controlling the electron beam 2 are disposed in the electron beam optical system PS, and an electric field and a magnetic field are distributed in the sample chamber 14. Such a distribution of the electromagnetic field affects the behavior of the plasma PZ. When the electric field caused by the condenser lens 3 and the like have a great effect on the behavior of the plasma PZ, the control operation for charging using the plasma generation device 11 may be affected. If there is a structure having a larger potential than a distribution of an electric field generated by charging the sample 6, charged particles (electrons and positive ions) in the plasma PZ are attracted to the structure, and thus plasma PZ is not capable of sufficiently controlling the charging of the sample 6.

In contrast, in the present embodiment, the plasma PZ can be guided to the vicinity of the sample 6 through the guide 12. Since the guide 12 is made of metal, the guide 12 has the same potential in the length direction inside, and the plasma PZ can be guided to the sample 6 without being affected by an external electric field. As a result, electrons or positive ions in the plasma PZ can control the charging of the sample 6. The charging of the surface of the sample 6 is controlled by a potential flowing as a charge-removing current Ir via the plasma PZ in the guide 12. Since the plasma PZ is guided to the vicinity of the sample 6 by the guide 12, the sample 6 is irradiated with the plasma PZ without being affected by the surrounding electric field.

By using the plasma PZ generated by the plasma generation device 11, the charging of the sample 6 can be controlled. For example, it is possible to remove charges accumulated on the surface of the sample 6 and to charge a sidewall of a pit or a groove of the sample 6 to an arbitrary voltage. At this time, in the plasma PZ generated by the plasma generation device 11, the balance of charged particles of either electrons or positive ions may be lost in the process of diffusion. In particular, when an amount of plasma to be irradiated becomes thin, even if both positive and negative charged particles are present, they may not have the properties of plasma. For example, the plasma PZ forms regions having different particle distributions such as forming a sheath due to a difference in mobility of charged particles on a structure wall surface, which may impair electrical neutrality. When the charge balance is lost, the number of charged particles required to control charging may be biased, but if charged particles such as electrons or positive ions can be irradiated, the effect does not change from the viewpoint of the control of the charging. Therefore, charged particles that have reached the sample 6 via the guide 12 in the plasma PZ generated by the plasma generation device 11 to which the bias voltage is applied bring about an effect of controlling the charging of the sample 6.

A retarding voltage for adjusting the energy of the electron beam 2 with which the sample 6 is irradiated can be applied to the stage 7. The retarding voltage is a voltage for decelerating electrons of the electron beam 2 immediately before the sample 6. The electron beam 2 emitted from the electron gun 1 is emitted to the sample 6 after being converged by the condenser lens 3, the objective lens 5, and the like. The acceleration voltage of the electron beam 2 emitted from the electron gun 1 is increased for the purpose of improving resolution. However, when the energy of the electron beam 2 emitted to the sample 6 is large, this deteriorates efficiency in generating secondary electrons 10 from the surface of the sample 6, and the sample 6 is charged. In addition, some samples 6 may be damaged when irradiated with high-energy electrons. For this reason, a voltage (retarding voltage) for decelerating electrons before being emitted to the sample 6 is applied to the stage 7. As a result, it is possible to prevent the sample 6 from being damaged and charged while achieving high image resolution. In a case where the charged particles irradiated on the sample 6 via the guide 12 have the properties of plasma by applying the retarding voltage using the retarding power supply 15 connected to the stage 7, a radio frequency bias voltage can be applied using the radio frequency power supply 17 in addition to the retarding voltage.

Figure 3:
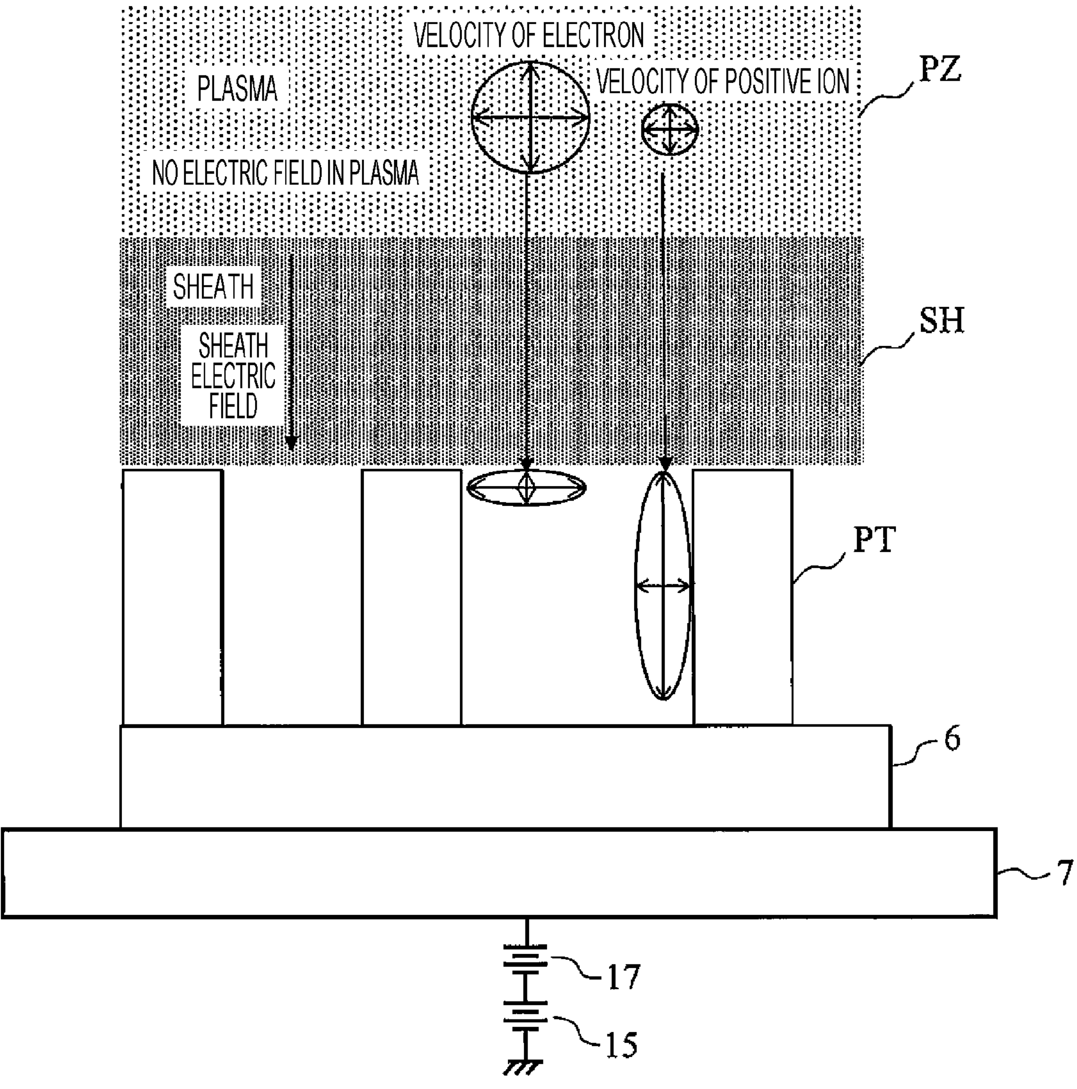
FIG. 3 is a diagram illustrating a velocity distribution of the charged particles in the plasma in the vicinity of a sample surface according to the embodiment.

As illustrated in FIG. 3, when a plasma state is formed above the sample 6, there is no electric field in the plasma PZ, and a sheath SH is formed on the surface of the sample 6. An electron jumping out from the plasma PZ to the sheath SH is decelerated, and an ion jumping out from the plasma PZ to the sheath SH is accelerated. Therefore, as illustrated in FIG. 3, there is a difference in velocity distribution between electrons and positive ions. At this time, a sheath potential can be controlled by changing the bias voltage applied to the plasma generation device 11. Since the ratio in flatness of thermal energy between electrons and positive ions varies depending on a sheath potential value, a distribution of positive ions and electrons that adhere to a side wall of a pattern PT formed in the sample 6 can be controlled. At this time, a certain charging distribution can be formed by applying a radio frequency voltage in a pulse form to the retarding voltage.

Imaging Method

Next, an imaging method according to the present embodiment will be described. First, plasma is generated by applying a bias voltage to the plasma generation device 11 that generates plasma. Then, charged particles in the plasma generated by the plasma generation device 11 are released to the sample 6 via the guide 12, and charges are applied onto the side wall of the pattern PT of the sample 6. Then, the sample 6 to which the charges have been applied is irradiated with the electron beam 2 to detect and image secondary electrons 10 emitted from the sample 6.

Further, the imaging method may include estimating a shape of the pattern of the sample 6 from a change in signal detected when the bias voltage applied to plasma generation device 11 is changed.

In addition, the imaging method may include changing the voltage applied to the plasma generation device 11 with a predetermined time width and a predetermined voltage change width until a final voltage is reached.

In addition, the imaging method may include applying a radio frequency bias voltage to the sample 6 when charged particles (electrons and positive ions) in the plasma are guided to the pattern of the sample 6.

In addition, the imaging method may include switching between the irradiation of the sample 6 with the electron beam 2 and the irradiation of the sample 6 with the charged particles (electrons and positive ions) in the plasma generated by the plasma generation device 11 at a predetermined timing.

In addition, the imaging method may include storing a plurality of luminance changes of known patterns with respect to the bias voltage applied to the plasma generation device 11 in a database, and estimating a shape of an unknown pattern by collating a luminance change of the unknown pattern with respect to the bias voltage applied to the plasma generation device 11 with the database.

In addition, the imaging method may include storing a plurality of luminance changes of known patterns with respect to a charged amount obtained by analysis in a database, and estimating a shape of an unknown pattern by collating a luminance change of the unknown pattern with respect to a charged amount obtained by actual measurement with the database.

Effects of Present Embodiment

By providing the plasma generation device 11 and the guide 12, it is possible to apply certain charges onto an inner wall of a pit or a groove of the pattern using charged particles (electrons and positive ions) in plasma generated by the plasma generation device 11 to form in the pit or the groove an electric field for pulling up secondary electrons generated in the pit or the groove. As a result, it is possible to check a state of a deep portion of the pit or the groove, thereby identifying a defect in the deep portion of the pit or the groove.

The control device 200 can easily estimate a shape of a pattern of the sample 6 from a change in signal detected by the secondary electron detector 8 when the bias voltage applied to the plasma generation device 11 is changed by collating the change with the databases.

In addition, the power supply control unit 204 changes the voltage applied to the plasma generation device 11 with a predetermined time width and a predetermined voltage change width until a final voltage is reached. As a result, the change in signal can be easily grasped.

The radio frequency power supply 17 can superimpose a radio frequency voltage on the retarding voltage to form a certain charging distribution on the sidewall of the pattern of the sample 6.

The control device 200 switches between the irradiation of the sample 6 with the electron beam 2 and the irradiation of the sample 6 with the charged particles in the plasma generated by the plasma generation device 11 at a predetermined timing. As a result, the sample can be irradiated with the electron beam 2 at a timing when there is no influence of plasma.

Example 1

Figure 4:
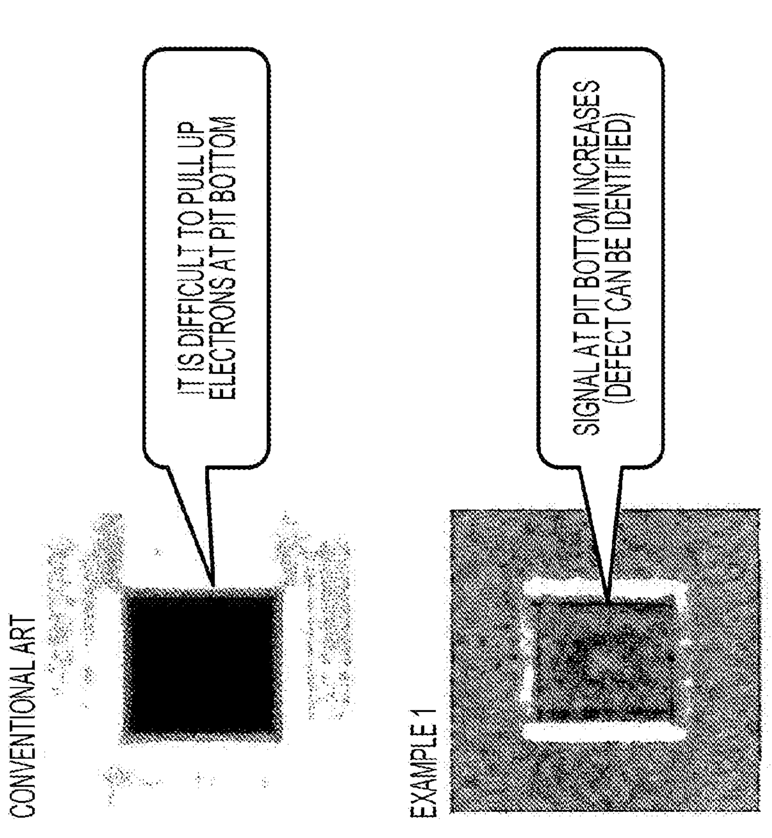
FIG. 4 is a diagram illustrating a simulation result at a pit bottom of a multilayer film when a side wall was charged using charged particles in plasma generated by a plasma generation device according to Example 1.
Figure 4:
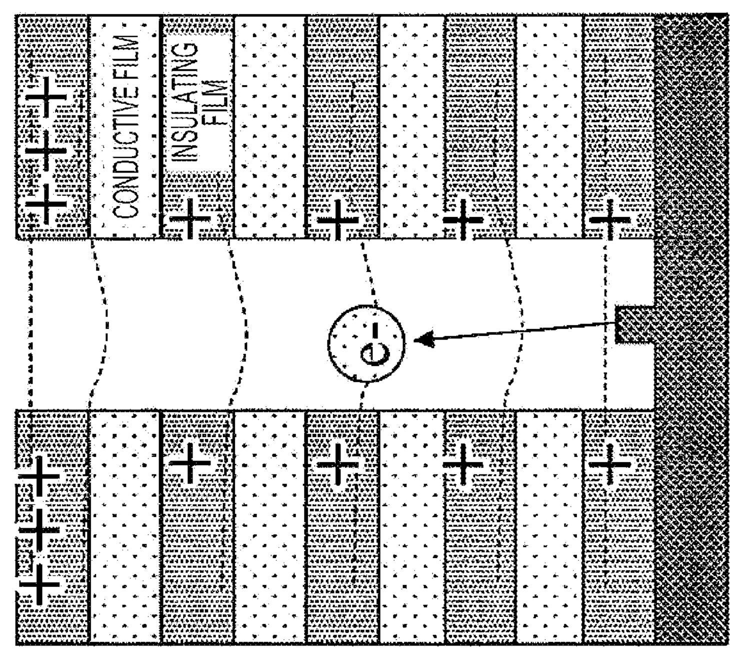

FIG. 4 illustrates a simulation result in a case where charges are applied into a pattern of a multilayer film is charged in the above-described configuration. A pattern of a multilayer film (a laminate including a conductive film of 100 nm and an insulating film of 100 nm) having a film thickness of 2 μm was prepared, and a bias voltage of 200 V was applied to the plasma generation device 11. Positive ions adhered to a side wall of the multilayer film, so that a signal at the pit bottom can be detected. As illustrated in FIG. 4, in the conventional art in which plasma is not irradiated, it is difficult to pull up electrons at the pit bottom, and thus, it is not possible to check a state of the pit bottom. In contrast, in Example 1 where plasma or charged particles in the plasma were irradiated, since the signal at the pit bottom increased, it was possible to check a state of the pit bottom, thereby identifying a defect at the pit bottom.

Example 2

Figure 5:
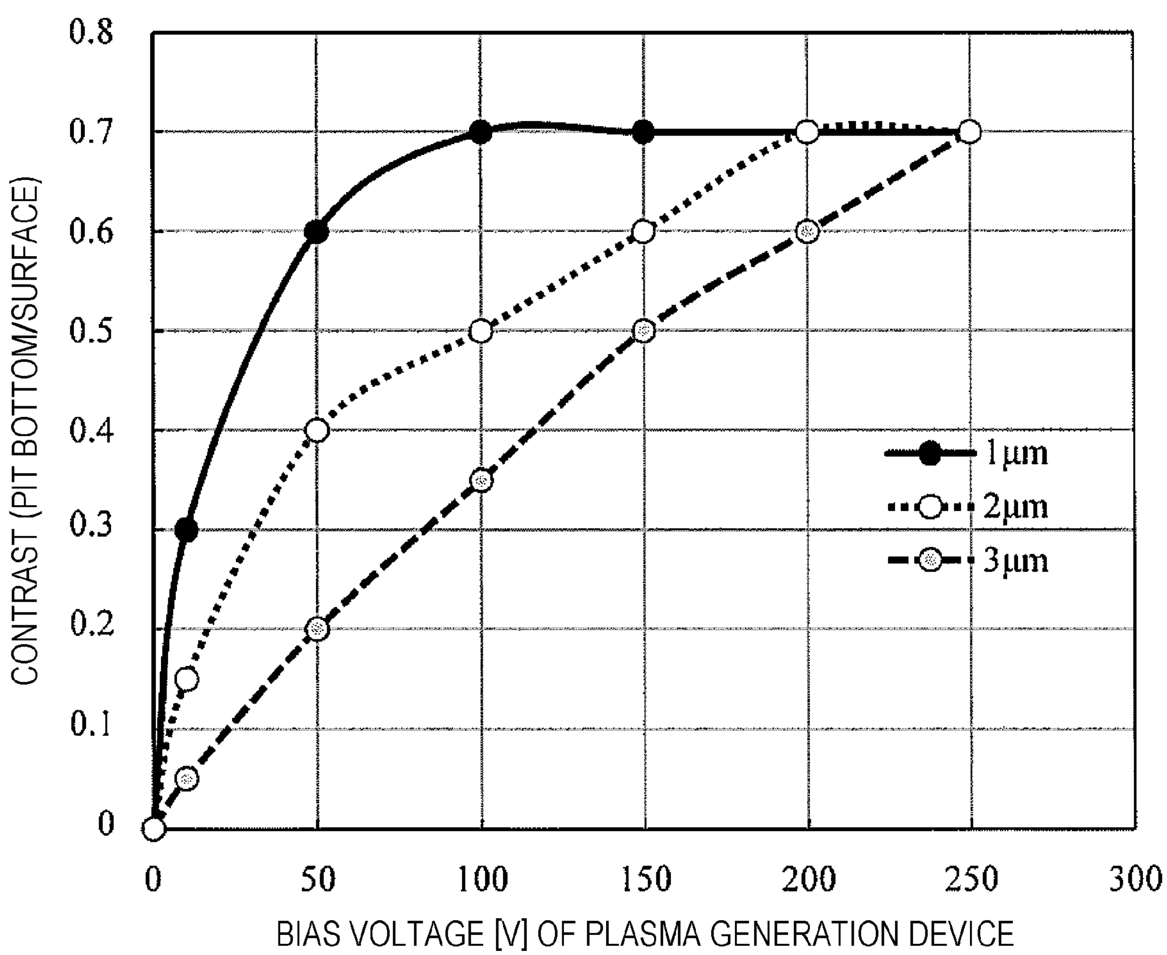
FIG. 5 is a diagram illustrating a change in contrast between a pit bottom and a surface of a pattern depending on a pattern shape when a bias voltage applied to a plasma generation device was changed according to Example 2.

A luminance ratio (contrast) between a pit bottom and a surface was examined using a bias voltage applied to the plasma generation device 11 as a parameter. FIG. 5 plots contrast values when the bias voltage is changed for multilayer film patterns having different film thicknesses. It can be seen that the contrast increases as the bias voltage increases, and it can be confirmed that the gradient of change varies depending on the pattern depth (film thickness).

Here, a method of estimating a shape (e.g., a cross-sectional shape) of an unknown pattern will be described. First, luminance changes of a plurality of patterns whose structures are known with respect to the bias voltage are acquired and stored in a database in advance. Then, a luminance change of an unknown pattern with respect to the bias voltage is acquired, and the acquired luminance change of the unknown pattern is collated with the above-described database, thereby making it possible to non-destructively estimate a shape of the unknown pattern.

The database may be a database based on analysis results. For example, luminance changes of a plurality of patterns whose structures are known with respect to charged amounts are acquired and stored in a database in advance. Then, a luminance change of an unknown pattern with respect to a charged amount is acquired, and the acquired luminance change of the unknown pattern is collated with the above-described database, thereby making it possible to non-destructively estimate a shape of the unknown pattern. The charged amount can be detected, for example, using the energy filter 9. At that time, an adjustment coefficient for associating the actual measurement and the analysis may be required. The adjustment coefficient may be set in advance for each pattern or material.

Example 3

Figure 6:
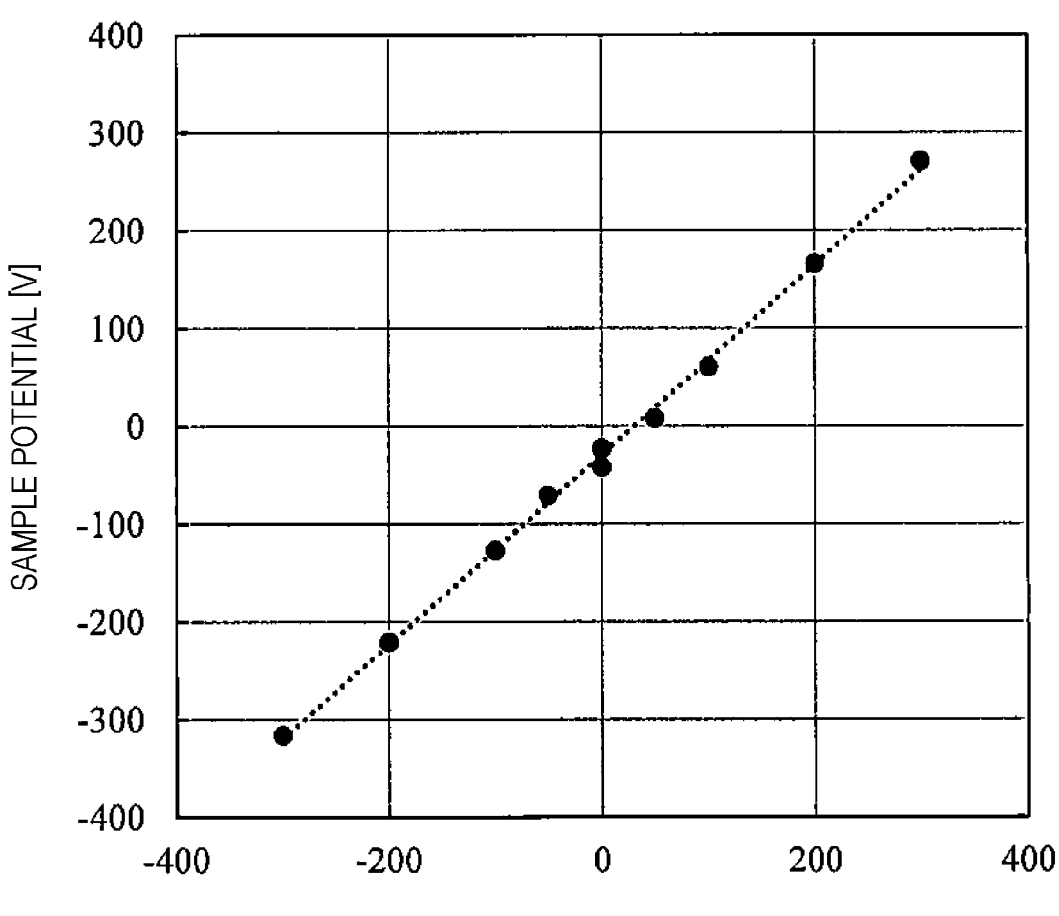
FIG. 6 is a diagram illustrating a relationship between a bias voltage applied to a plasma generation device and a potential applied to a sample according to Example 3.

FIG. 6 illustrates a result of measuring a change in potential of the sample with respect to a bias voltage of the plasma generation device 11 in Example 3. The bias voltage of the plasma generation device 11 on the horizontal axis is an input value designated by the user, and the sample potential on the vertical axis is a potential of the sample (sample potential) when the sample is irradiated with charged particles in the plasma generated by the plasma generation device 11 to which the bias voltage is applied through the guide 12. The sample potential can be detected, for example, using a metal mesh electrode (energy filter) which is provided at a front stage of the detector for detecting the energy of the secondary electrons and to which a voltage can be applied. From FIG. 6 in which a potential at which secondary electrons of several eV, which are emitted in a large amount, are cut (not entering the detector) when the potential of the energy filter is changed can be regarded as a charging potential, the sample potential was linearized with respect to the bias voltage although there is an offset of several tens of V. If the data illustrated in FIG. 6 is acquired in advance, a sample potential can be estimated from the applied bias voltage without the energy filter.

Modified Example

In the embodiment, the plasma generation device 11 is attached to the wall surface of the sample chamber 14, but the attached position of the plasma generation device 11 is not limited to the wall surface of the sample chamber 14. For example, the plasma generation device 11 may be provided outside the sample chamber 14, and the guide may be attached to the wall surface of the sample chamber 14.

What is claimed is:

1. A charged particle beam device for irradiating a sample arranged in a sample chamber to be observed with a charged particle beam, the charged particle beam device comprising:

a plasma generation device to which a bias voltage is applicable to generate plasma containing charged particles for applying charges onto a side wall of a pattern of the sample;

a guide that guides the charged particles in the plasma generated by the plasma generation device to the pattern of the sample; and a radio frequency power supply that applies a radio frequency bias voltage to the sample when the charged particles in the plasma are guided to the pattern of the sample.

2. The charged particle beam device according to claim 1, further comprising:

a detector that detects secondary electrons emitted from the sample by irradiating the sample with the charged particle beam; and an estimation unit that estimates a shape of the pattern of the sample from a change in signal detected by the detector when the bias voltage applied to the plasma generation device is changed.

3. The charged particle beam device according to claim 2, further comprising a power supply control unit that changes a voltage applied to the plasma generation device with a predetermined time width and a predetermined voltage change width until a final voltage is reached.

4. The charged particle beam device according to claim 1, further comprising a switching unit that switches between the irradiation of the sample with the charged particle beam and the irradiation of the charged particles in the plasma generated by the plasma generation device at a predetermined timing.

5. The charged particle beam device according to claim 1, further comprising:

a database that stores a plurality of luminance changes of known patterns with respect to the bias voltage applied to the plasma generation device; and an estimation unit that estimates a shape of an unknown pattern by collating a luminance change of the unknown pattern with respect to the bias voltage applied to the plasma generation device with the database.

6. The charged particle beam device according to claim 1, further comprising:

a database that stores a plurality of luminance changes of known patterns with respect to a charged amount obtained by analysis; and an estimation unit that estimates a shape of an unknown pattern by collating a luminance change of the unknown pattern with respect to a charged amount obtained by actual measurement with the database.

7. The charged particle beam device according to claim 1, wherein the plasma generation device or the guide is provided in the sample chamber in an insulated state.

8. An imaging method comprising:

applying a bias voltage to a plasma generation device that generates plasma such that plasma is generated by the plasma generation device;

emitting charged particles in the plasma generated by the plasma generation device to a sample via a guide to charge a side wall of a pattern of the sample; and irradiating the charged sample with a charged particle beam to detect and image secondary electrons emitted from the sample; and applying a radio frequency bias voltage to the sample using a radio frequency power supply when the charged particles in the plasma are guided to the pattern of the sample.

9. The imaging method according to claim 8, further comprising estimating a shape of the pattern of the sample from a change in signal detected when the bias voltage applied to plasma generation device is changed.

10. The imaging method according to claim 8, further comprising changing a voltage applied to the plasma generation device with a predetermined time width and a predetermined voltage change width until a final voltage is reached.

11. The imaging method according to claim 8, further comprising switching between the irradiation of the sample with the charged particle beam and the irradiation of the charged particles in the plasma generated by the plasma generation device at a predetermined timing.

12. The imaging method according to claim 8, further comprising:

storing a plurality of luminance changes of known patterns with respect to the bias voltage applied to the plasma generation device in a database; and estimating a shape of an unknown pattern by collating a luminance change of the unknown pattern with respect to the bias voltage applied to the plasma generation device with the database.

13. The imaging method according to claim 8, further comprising:

storing a plurality of luminance changes of known patterns with respect to a charged amount obtained by analysis in a database; and estimating a shape of an unknown pattern by collating a luminance change of the unknown pattern with respect to a charged amount obtained by actual measurement with the database.

* * * * *